US010855267B2

(12) United States Patent
Ning et al.

(10) Patent No.: US 10,855,267 B2
(45) Date of Patent: Dec. 1, 2020

(54) ELECTRONIC SWITCH AND ELECTRONIC APPARATUS INCLUDING THE SAME

(71) Applicant: Murata Manufacturing Co., Ltd., Nagaokakyo (JP)

(72) Inventors: Long Ning, Hubei (CN); Gang Li, Hubei (CN)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/831,878

(22) Filed: Mar. 27, 2020

(65) Prior Publication Data

US 2020/0313666 A1  Oct. 1, 2020

(30) Foreign Application Priority Data

Mar. 29, 2019 (CN) .......................... 2019 1 0256207

(51) Int. Cl.
*H03K 17/0412* (2006.01)
*H03K 17/0812* (2006.01)

(52) U.S. Cl.
CPC . *H03K 17/04123* (2013.01); *H03K 17/08122* (2013.01)

(58) Field of Classification Search
CPC ...... H03K 17/04123; H03K 17/08122; H02M 3/02; H02M 3/04; H02M 7/04
See application file for complete search history.

(56) References Cited

U.S. PATENT DOCUMENTS

| 5,796,277 | A  | * | 8/1998 | Kim ................... H03K 17/6871 327/108 |
| 2006/0181246 | A1 | * | 8/2006 | Hackner ................. H02M 1/08 320/148 |
| 2013/0234779 | A1 | * | 9/2013 | Klug, Jr. .......... H03K 17/04123 327/432 |

\* cited by examiner

*Primary Examiner* — John W Poos
(74) *Attorney, Agent, or Firm* — Keating & Bennett, LLP

(57) ABSTRACT

An electronic switch includes a first NMOS transistor connected between a positive input terminal and an output terminal; a first diode, a second resistor, a first capacitor, and a third switching element sequentially connected in series between a drain of the first NMOS transistor and a negative input terminal; a first resistor connected between a positive input terminal and a node between the first capacitor and the third switching element; a third resistor connected between a gate of the first NMOS transistor and a node between the second resistor and the first capacitor; and a second capacitor, a second diode, and a fourth resistor connected in parallel between a source of the first NMOS transistor and a node between the third resistor and the gate of the first NMOS transistor.

7 Claims, 8 Drawing Sheets

First stage in operating process in power-on transient state

Second stage in operating process in power-on transient state

Third stage in operating process in power-on transient state

First stage in operating process in steady state

Second stage in operating process in steady state

ELECTRONIC SWITCH AND ELECTRONIC APPARATUS INCLUDING THE SAME

CROSS REFERENCE TO RELATED APPLICATIONS

This application claims the benefit of priority to Chinese Patent Application No. 201910256207.8 filed on Mar. 29, 2019. The entire contents of this application are hereby incorporated herein by reference.

BACKGROUND OF THE INVENTION

1. Field of the Invention

The present application relates to an electronic switch and an electronic apparatus including the electronic switch.

2. Description of the Related Art

With the continuous development of the electronics industry, more and more electronic apparatuses require electronic switches. An electronic switch is an electronic device for turning on/off power supply from a power supply. FIGS. 11A to 11E are diagrams for explaining examples of the related art. FIG. 11A shows an example of an application scenario of a conventional electronic switch. In FIG. 11A, a power supply module A01 obtains electric energy from an input terminal, and then converts it to a required output. A switch control module A02 and an inrush protection module A03 are required at the input terminal.

FIG. 11B is a schematic diagram of an example of a conventional solution for achieving the switch control module A02 described above. In this solution, the function of the switch control module A02 is provided by a relay B01. The relay can be switched on or off by controlling the power supply to a relay coil of the relay B01. However, since the switching on or off of the relay is achieved by mechanical magnetic force pull-in, and the pull-in speed is generally at a level of ms, it is not suitable for scenarios that require fast switching. Further, a release speed is slower than the pull-in speed, and due to an arcing phenomenon of the relay, a voltage jitter will occur at two ends of a relay reed.

FIG. 11D is a schematic diagram of another example of a conventional solution for achieving the switch control module A02 described above. In this solution, the function of the switch control module A02 is provided by a PMOS (Positive channel Metal-Oxide Semiconductor) transistor D01. For low voltage and low current application scenarios, it is simple and low-cost to use a PMOS. As shown in FIG. 11D, due to the characteristics of the PMOS itself, after the PMOS transistor is turned on, it will not be turned off due to a change in the drain potential. Therefore, using the control method as illustrated can effectively control the turning on/off of the PMOS transistor. However, due to the characteristics of the PMOS transistor, the PMOS transistor is often unable to withstand a relatively large voltage level, and with the increase of a voltage withstand, an on-resistance of the PMOS transistor will be much greater than that of a NMOS (Negative channel Metal-Oxide Semiconductor) transistor under the same voltage withstand level, which results in a limitation on the switching applications of PMOS transistors.

FIG. 11C is a schematic diagram of yet another example of a conventional solution for achieving the switch control module A02 described above. In this solution, the function of the switch control module A02 is provided by an NMOS transistor C01. For high voltage and high current application scenarios, since NMOS has a higher voltage withstand level and a lower on-resistance, using an NMOS transistor as a switch is a better choice. Due to the characteristics of the NMOS itself, after the NMOS transistor is turned on, it will be turned off due to a change in the drain potential. Therefore, it is necessary to adopt a specific level to drive the NMOS switch. When the NMOS transistor is used as a high-end switch, the driving principle is the same, that is, providing a sufficient driving potential to prevent the NMOS from being turned off when a source voltage approaches a drain voltage after the NMOS is turned on.

FIG. 11E is a schematic diagram of an example of a conventional solution for achieving the inrush protection module A03 described above. In this solution, the function of the inrush protection module A03 is provided by an NTC device (temperature coefficient resistor) E01, that is, the NTC device E01 is connected in series in the input circuit. Since the voltage across the capacitor cannot be abruptly changed at the moment of powering on the input, a capacitor C has a low impedance relative to the input ground at the moment of power on, so that a great inrush current from the input source will flow through the input circuit (the inrush current is approximately equal to the input voltage divided by the DC equivalent impedance of the capacitor). In order to protect the components on the input circuit from being damaged by the inrush current, the NTC device can limit the inrush current to a relatively low level (the resistance of the NTC device is many times the DC equivalent impedance of the capacitor), to avoid a great inrush current from causing voltage oscillations on the circuit.

However, in the existing solutions, in order to achieve an inrush prevention function, a combination of the switch control module A02 and the inrush protection module A03 as described above is generally considered. When a relay or a PMOS transistor is selected as the switch control module, as described above, there are many disadvantages in characteristics. Moreover, if an NMOS transistor is selected as the switch control module, since it needs an independent driving structure, when it is further combined with the inrush protection module A03 based on a temperature coefficient resistance, the size of the entire electronic switch will become larger and occupy more space. In addition, using the NTC device-based inrush protection module is not ideal due to the following reasons: for example, the large size of the NTC device itself, which requires an occupancy space; during a working process, especially in the steady state, the current always flows through the NTC device, which generates heat and excessive energy consumption; and a higher cost of the NTC device.

SUMMARY OF THE INVENTION

Preferred embodiments of the present invention provide electronic switches and electronic apparatuses each including an electronic switch, which are each able to achieve a good switch control, which is performed based on an NMOS transistor, with a small size, low energy consumption, and low cost.

According to a preferred embodiment of the present disclosure, an electronic switch includes a first NMOS transistor connected between a positive input terminal and an output terminal; a first diode, a second resistor, a first capacitor, and a third switching element sequentially connected in series between a drain of the first NMOS transistor and a negative input terminal; a first resistor connected between the positive input terminal and a node between the first capacitor and the third switching element; a third resistor connected between a gate of the first NMOS transistor and a node between the second resistor and the first capacitor; and a second capacitor, a second diode, and a fourth resistor connected in parallel between a source of the first NMOS transistor and a node between the third resistor and the gate of the first NMOS transistor.

According to a preferred embodiment of the present disclosure, an electronic apparatus includes an electronic switch according to a preferred embodiment of the present invention.

According to preferred embodiments of the present disclosure, it is possible to provide electronic switches and electronic apparatuses each including an electronic switch, each realizing a good switch control, which is performed based on an NMOS transistor, with a small size, low energy consumption, and low cost.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present application will be described with reference to the drawings.

Figure 1:
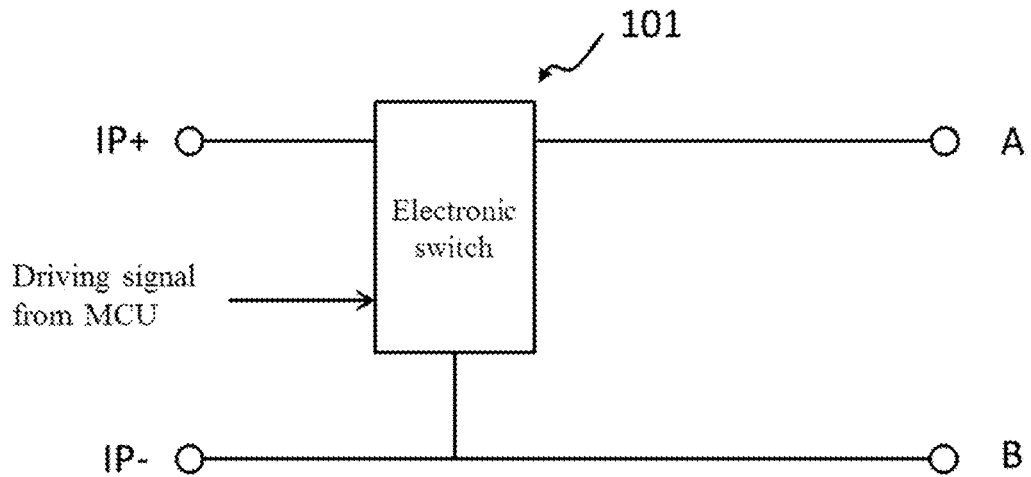
FIG. 1 is a schematic diagram illustrating an electronic switch 101 according to a preferred embodiment of the present application.

FIG. 1 is a schematic diagram illustrating an electronic switch 101 according to a preferred embodiment of the present application. The electronic switch 101 is connected between a positive input terminal IP+ and a positive output terminal A, and is connected between a negative input terminal IP– and a negative output terminal B. A control signal from MCU is used to turn on/off the connection between the positive input terminal IP+ and the positive output terminal A.

Figure 2:
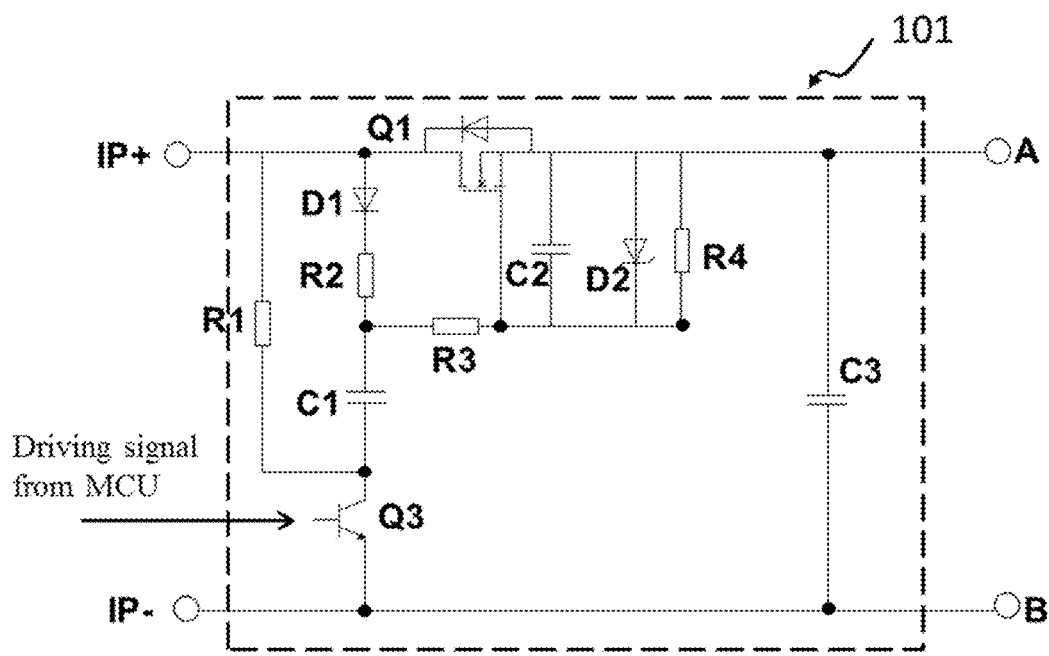
FIG. 2 is a circuit diagram illustrating a specific configuration of the electronic switch 101 according to a preferred embodiment of the present application.

FIG. 2 is a circuit diagram illustrating a specific configuration of the electronic switch 101. The electronic switch 101 includes an NMOS transistor as a switching element. As mentioned above, a NMOS has a relatively high voltage withstand level and a relatively low on-resistance.

The electronic switch 101 includes a first NMOS transistor Q1 connected between the positive input terminal IP+ and the positive output terminal A. The first NMOS transistor Q1 is a core switching element of the electronic switch 101 and passes power current. The first NMOS transistor Q1 may be turned on/off by controlling a voltage of a gate thereof.

A first diode D1, a second resistor R2, a first capacitor C1, and a third switching element Q3 are sequentially connected in series between a drain of the first NMOS transistor and the negative input terminal IP–.

The first diode D1 is a unidirectional device, and is used to block a discharge circuit from C1 to the input terminal when the first capacitor C1 is discharged.

The second resistor R2 is a charging current-limiting resistor when the first capacitor C1 is charged, and is used to limit a magnitude of the charging current when the first capacitor C1 is charged.

The first capacitor C1 is used to perform a high-frequency charging and discharging process to provide the function of a voltage pump.

The third switching element Q3 is used to perform high-frequency switching according to an external signal from the MCU and the like, such that charging and discharging of the first capacitor C1 is controlled. Here, it is preferable to use, for example, a triode with a good high-frequency characteristic as the third switching element Q3.

A first resistor R1 is connected between the positive input terminal IP+ and a node between the first capacitor C1 and the third switching element Q3.

The first resistor R1 is used to adjust a voltage across the gate and a source of the first NMOS transistor Q1, and used for voltage division when the first capacitor C1 is discharged.

A third resistor R3 is connected between the gate of the first NMOS transistor and a node between the second resistor R2 and the first capacitor C1.

The third resistor R3 is used to adjust a voltage across the gate and the source of the first NMOS transistor Q1.

A second capacitor C2, a second diode D2, and a fourth resistor R4 are connected in parallel between the source of the first NMOS transistor and a node between the third resistor R3 and the gate of the first NMOS transistor.

The second capacitor C2 is used for fast voltage division in a pre-turning-on transient state. Here, the second capacitor C2 may preferably be, for example, a pF level capacitor.

The second diode D2 is used to clamp the voltage across the gate and the source of the first NMOS transistor Q1 so as to ensure that the voltage across the gate and the source is within a specification value of Q1. The second diode may preferably be, for example, a Zener diode.

The fourth resistor R4 is used to adjust the voltage across the gate and the source of the first NMOS transistor Q1, and to provide a discharge circuit for the second capacitor C2 when the first NMOS transistor Q1 is turned off.

A load (circuit) controlled by on/off in the subsequent stage is connected between the positive output terminal A and the negative output terminal B. In order to facilitate understanding of the operating process of preferred embodiments of the present application, an equivalent capacitance of the load is represented here as a third capacitor C3. In general, the equivalent capacitance of the load controlled by on/off is much greater than the capacitance of the second capacitor C2, and may be regarded as a capacitor of μf level.

Hereinafter, an operating process of the electronic switch 101 according to the present preferred embodiment will be described in detail with reference to FIGS. 3 to 7.

First, an operating process of the electronic switch 101 in a power-on transient state will be described with reference to FIGS. 3 to 5.

Figure 3:
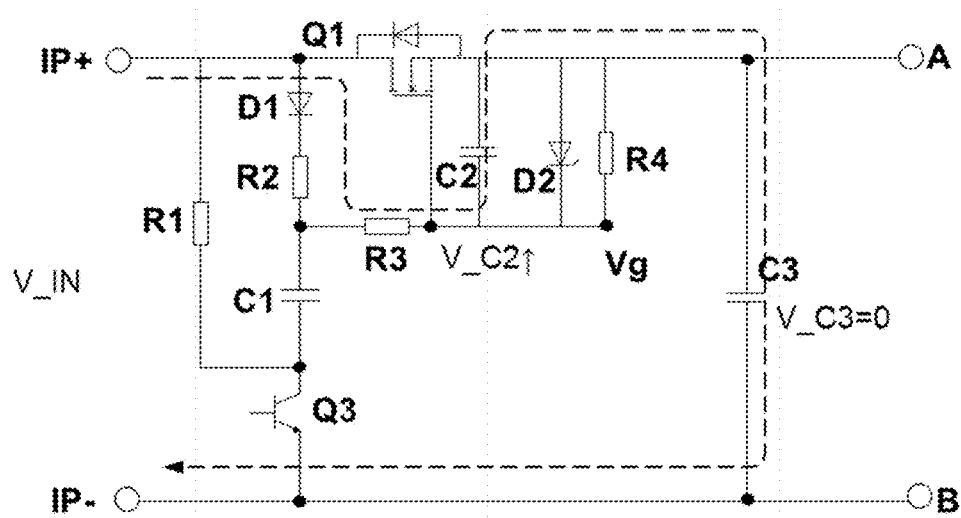
FIG. 3 is a diagram illustrating a first stage in an operating process of the electronic switch 101 in a power-on transient state according to a preferred embodiment of the present application.

FIG. 3 is a diagram illustrating a first stage in an operating process of the electronic switch 101 in a power-on transient state according to a preferred embodiment of the present application. As illustrated, at the moment of power-on, the input current flows as indicated by the dotted line in the FIG. 3. In this process, the second capacitor C2 between the drain and the source of the first NMOS transistor Q1 is charged. The voltage across the second capacitor C2 rises (here, the voltage across the second capacitor C2 is also a drain-source voltage of the first NMOS transistor Q1). Since the capacitance of the third capacitor C3 is much greater than that of the second capacitor C2, the capacitive reactance of the third capacitor C3 is much lower than that of the second capacitor C2. Thus, in the power-on transient state, the divided voltage on the second capacitor C2 will be greater than that of the third capacitor C3. In other words, the second capacitor C2 will be quickly charged, while the third capacitor C3 will be gently precharged.

Figure 4:
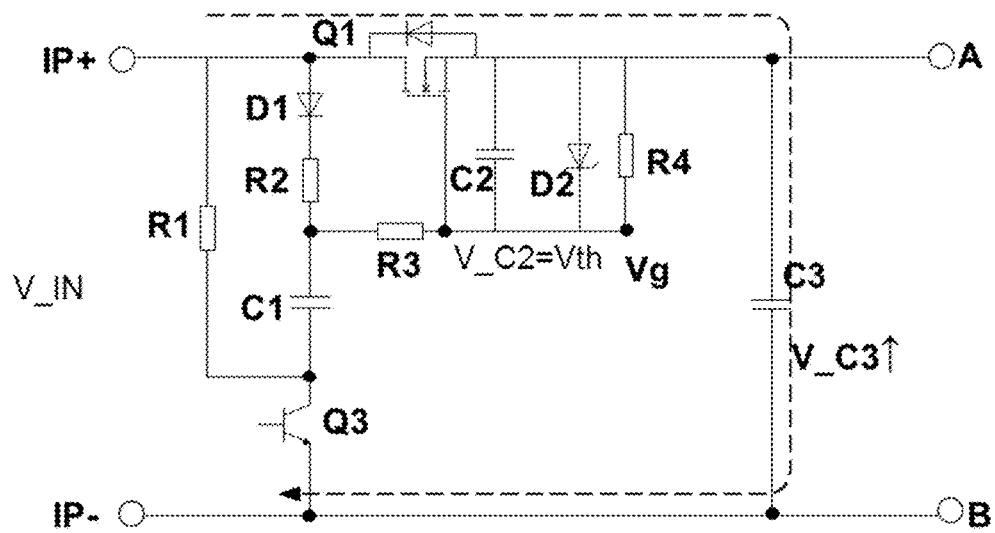
FIG. 4 is a diagram illustrating a second stage in an operating process of the electronic switch 101 in a power-on transient state according to a preferred embodiment of the present application.

FIG. 4 is a diagram illustrating a second stage in the operating process of the electronic switch 101 in the power-on transient state. When the voltage across the second capacitor C2 rises to an on-voltage Vth of the first NMOS transistor Q1, the first NMOS transistor Q1 starts turning on. At this time, as indicated by the dotted line in FIG. 4, the input voltage may directly charge the third capacitor C3 through the first NMOS transistor Q1, thus completing pre-charging of the third capacitor C3.

Figure 5:
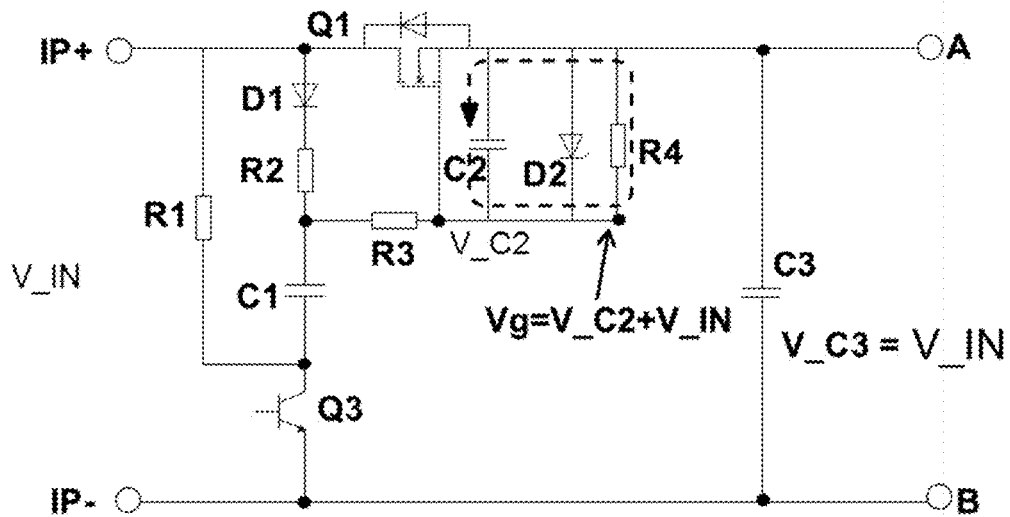
FIG. 5 is a diagram illustrating a third stage in an operating process of the electronic switch 101 in a power-on transient state according to a preferred embodiment of the present application.

FIG. 5 is a diagram illustrating a third stage in the operating process of the electronic switch 101 in the power-on transient state. When the voltage across the third capacitor C3 rises to an input voltage V_IN, the charging current in a charging path of the third capacitor C3 drops to zero. Since there is a residual voltage on the second capacitor C2, the potential of Vg at this time is a voltage V_C2 across the second capacitor C2 plus the input voltage V_IN. Afterwards, the voltage across C2 may be consumed by the fourth resistor R4, so that the V_C2 is again lower than the on-voltage Vth of the first NMOS transistor Q1, and the first NMOS transistor Q1 may be switched from the on state to the off state, that is, entering a standby state in which the first NMOS transistor Q1 waits to be turned on or off by control.

As explained with reference to FIGS. 3 to 5, according to a preferred embodiment of the present application, during the operating process in the power-on transient state, the charging of the third capacitor C3, which is used as the equivalent capacitance of the load, is not completed instantaneously, but is achieved through two processes, thus reducing an inrush current caused by the instantaneous charging of the third capacitor C3.

Next, an operating process of the electronic switch 101 in a steady state will be described with reference to FIGS. 6 and 7.

Figure 6:
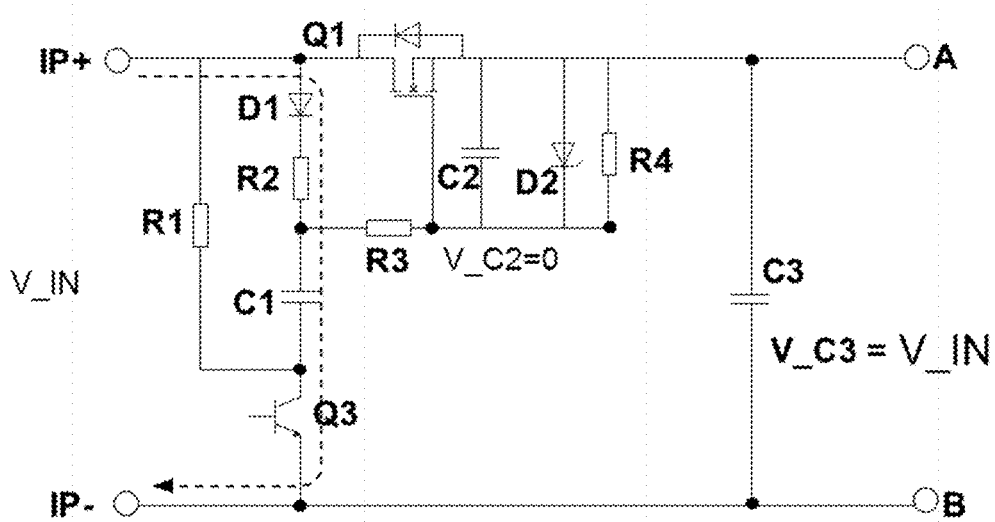
FIG. 6 is a diagram illustrating a first stage in an operating process of the electronic switch 101 in a steady state according to a preferred embodiment of the present application.

FIG. 6 is a diagram illustrating a first stage in an operating process of the electronic switch 101 in a steady state. When the circuit enters into a steady state (i.e., after the input voltage is stabilized), a high-frequency driving signal from an MCU or the like may be transmitted to a base of the third switching element Q3, thus periodically driving the third switching element Q3 to be turned on/off. At this time, the turning-on of the first NMOS transistor Q1 may be achieved through the following mechanism.

When the third switching element Q3 is turned on, the input voltage may pass through the first diode D1, the second resistor R2, the first capacitor C1, and the third switching element Q3, as illustrated by the dotted line in FIG. 5, thus forming a charging circuit for the first capacitor C1. Here, R2 is set to a value that allows C1 to be quickly charged when Q3 is turned on.

Figure 7:
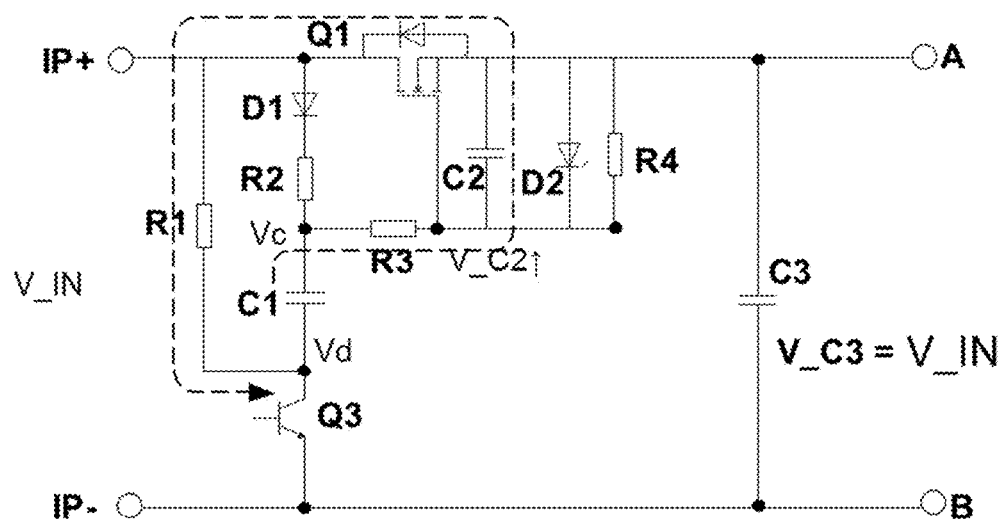
FIG. 7 is a diagram illustrating a second stage in an operating process of the electronic switch 101 in a steady state according to a preferred embodiment of the present application.

FIG. 7 is a diagram illustrating a second stage in the operating process of the electronic switch 101 in the steady state. When the third switching element Q3 is turned off, due to the characteristics of the capacitor, a voltage across C1 cannot be abruptly changed, and an input voltage may charge the second capacitor C2 along a path as illustrated by the dotted line such that V_C2 rises, which means that the lower end potential Vd of C1 is the input voltage, and the upper end potential Vc is raised. Thus, since C1 is charged and discharged and the potential is raised, it can be ensured that after the first NMOS transistor Q1 is turned on, there is still a sufficient driving level to drive the gate-source.

As explained with reference to FIGS. 6 and 7, according to a preferred embodiment of the present application, during the operating process in the steady state, the third switching element Q3 is provided with a high-frequency control signal to be periodically turned on/off, thus providing an on/off control to the first NMOS transistor Q1 and achieving a switching function of the electronic switch 101. Further, in this process, as a path through which the power current flows from the input terminal IP+ to the positive output terminal A, the power current only flows through the first NMOS transistor Q1 with a very low on-resistance. Thus, the on-resistance is very low during the turning-on process of the electronic switch 101, and there is no additional energy consumption.

Modification 1

Figure 8:
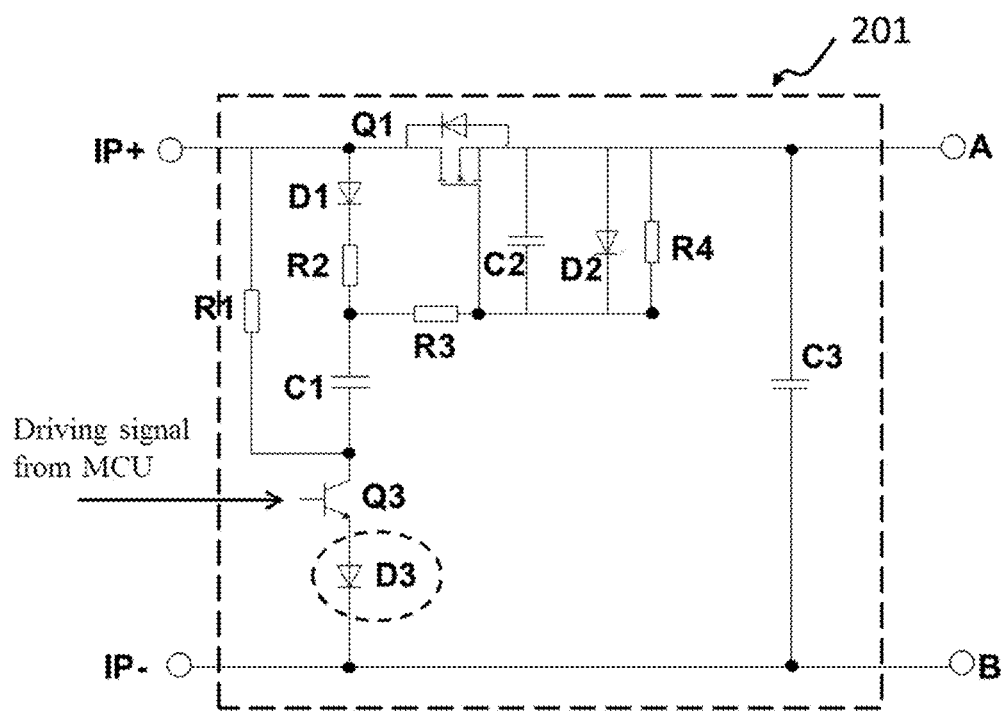
FIG. 8 is a circuit diagram illustrating a specific configuration of an electronic switch 201 according to a first modification of a preferred embodiment of the present invention.

FIG. 8 is a circuit diagram illustrating a configuration of an electronic switch 201 according to a first modification of a preferred embodiment of the present application. The electronic switch 201 of this modification is different from the electronic switch 101 described above in that a third diode D3 is further connected in series between the third switching element Q3 and the negative input terminal IP−. The remaining elements are the same or substantially the same as those of the electronic switch 101, and the same or substantially the same elements are indicated with the same reference numbers, and corresponding descriptions are omitted.

According to the electronic switch 201 of the first modification, the third diode D3 is further connected in series between the third switching element Q3 and the negative input terminal IP−, thus preventing the electronic switch 201 from being damaged due to a reversely flowing current when the electronic switch 201 is reversely connected.

Modification 2

Figure 9:
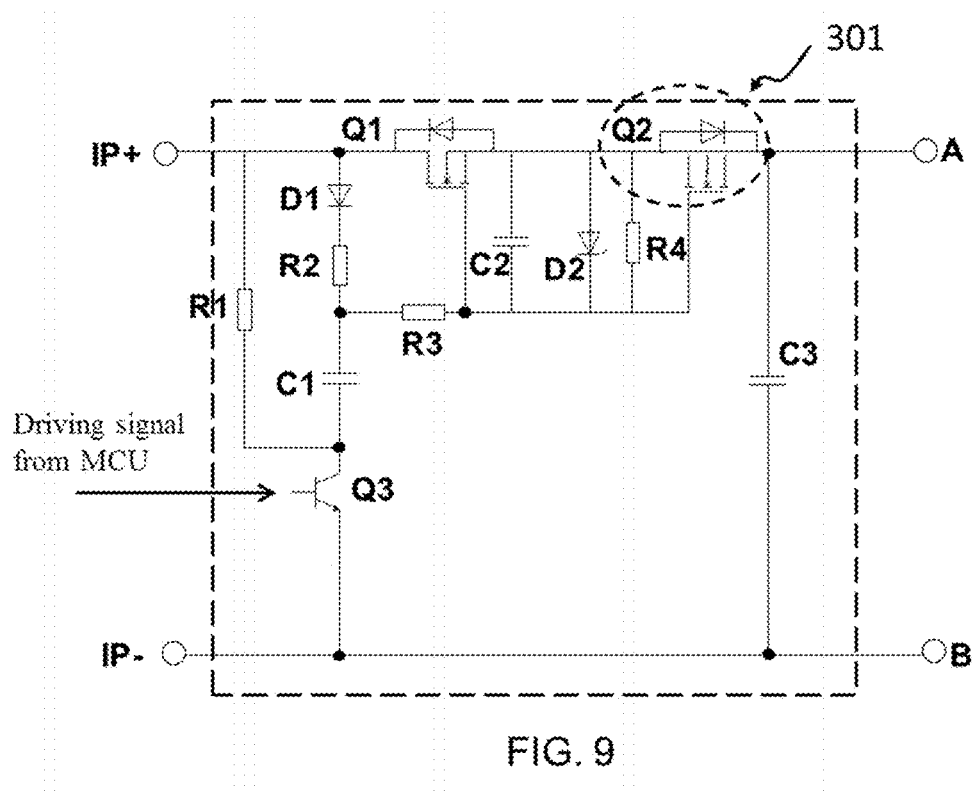
FIG. 9 is a circuit diagram illustrating a specific configuration of an electronic switch 301 according to a second modification of a preferred embodiment of the present invention.

FIG. 9 is a circuit diagram illustrating a configuration of an electronic switch 301 according to a second modification of a preferred embodiment of the present application. The electronic switch 301 of this modification is different from the electronic switch 101 described above in that a second NMOS transistor Q2 is further connected in series in the reverse direction between the first NMOS transistor Q1 and the positive output terminal A. The remaining elements are the same or substantially the same as those of the electronic switch 101, and the same or substantially the same elements are indicated with the same reference numbers, and corresponding descriptions are omitted.

As shown in FIG. 9, the drains of the first NMOS transistor Q1 and the second NMOS transistor Q2 are connected to each other to define a switch structure having an input reverse connection protecting function. When the input is reversely connected, the on-path may be blocked by the second NMOS transistor Q2, which can prevent the electronic switch 301 from being damaged due to a reversely flowing current when the electronic switch 301 is reversely connected.

Modification 3

Figure 10:
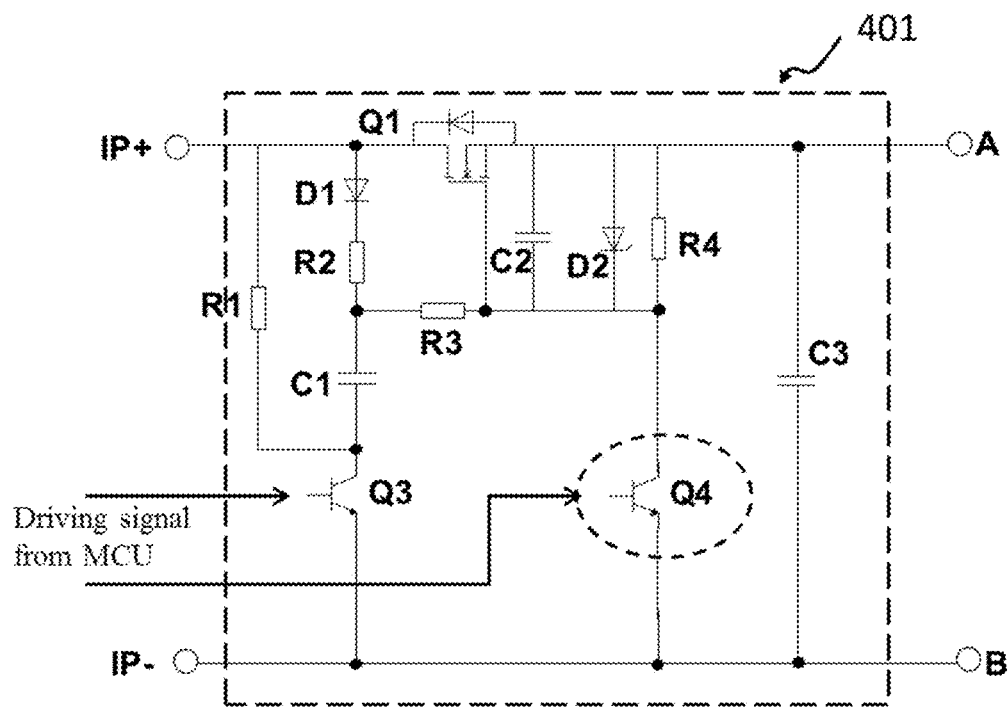
FIG. 10 is a circuit diagram illustrating a specific configuration of an electronic switch 401 according to a third modification of a preferred embodiment of the present invention.
Figure 11A:
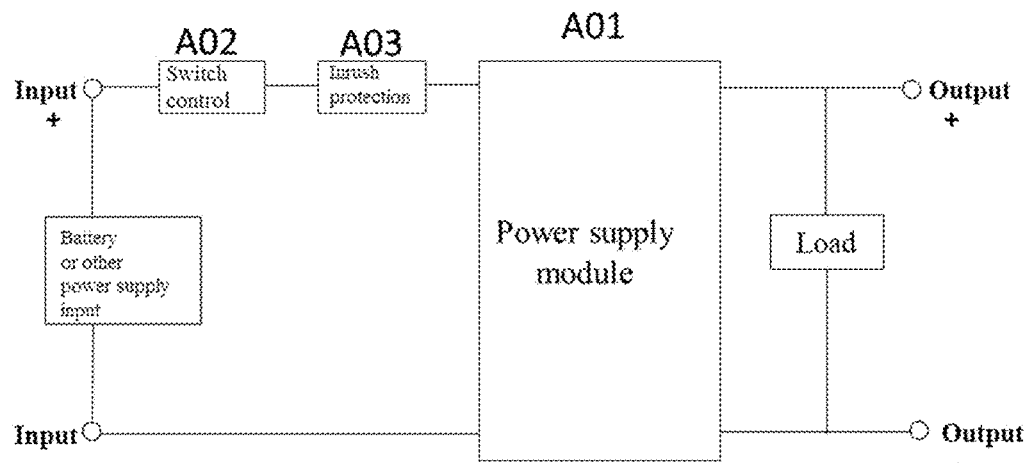
FIGS. 11A to 11E are diagrams for explaining examples of the related art.
Figure 11B:
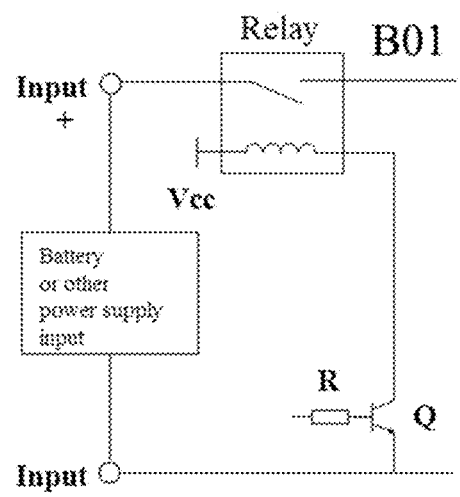
Figure 11C:
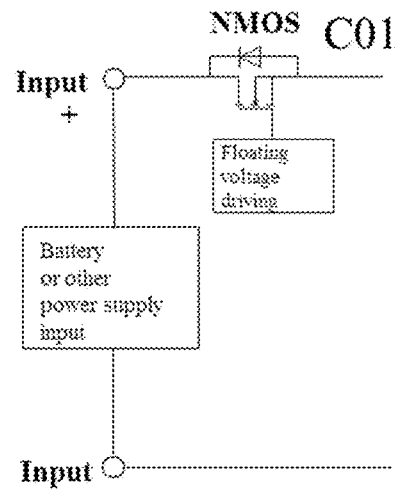
Figure 11D:
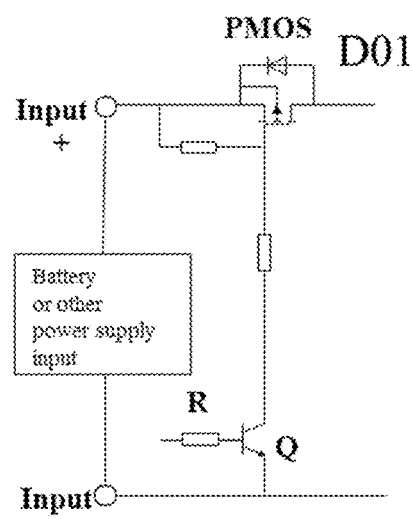
Figure 11E:
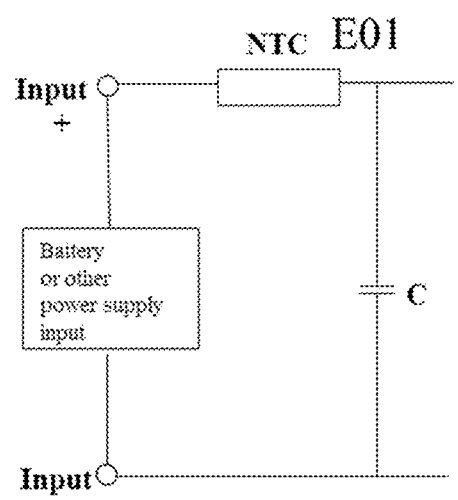

FIG. 10 is a circuit diagram illustrating a configuration of an electronic switch 401 according to a third modification of a preferred embodiment of the present application. The electronic switch 401 of this modification is different from the electronic switch 101 described above in that a fourth switching element Q4 is further connected in series between the negative input terminal IP− and a node between the third resistor R3 and the second capacitor C2. The remaining elements are the same or substantially the same as those of the electronic switch 101, and the same or substantially the same elements are indicated with the same reference numbers, and corresponding descriptions are omitted.

As shown in FIG. 10, by connecting the fourth switching element Q4 in series between the negative input terminal IP− and the node between the third resistor R3 and the second capacitor C2, the fourth switching element Q4 may be turned on or off by a control signal from the MCU, thus controlling the gate potential of the first NMOS transistor Q1. When the fourth switching element Q4 is turned on, the gate potential of the first NMOS transistor Q1 may be shorted to ground through the fourth switching element Q4, thus providing a function of fast turning-off, which may further accelerate the turning-off (protection) speed of the electronic switch 401.

Here, it is preferable that the fourth switching element Q4 is defined by the same device as the third switching element Q3.

The above-described modifications 1 to 3 exemplify some possible modifications of preferred embodiments of the present application. These modifications may be combined or replaced with each other according to practical needs, and a solution provided thus also defines a preferred embodiment of the present application.

Additionally, in the above description, a preferred embodiment of the present invention has been described in the form of an electronic switch. However, preferred embodiments of the present invention also include an electronic apparatus using any one of the electronic switches 101 to 401 described above.

Further, in the preferred embodiments described above, each component has been described independently, but it is not limited thereto. As long as the function of each element in the circuit can be achieved, a structure in the circuit or a characteristic of an existing device can be used as an equivalent element to achieve the function of the related element. Such changes are also included in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic switch, comprising:
   a first NMOS transistor connected between a positive input terminal and an output terminal;
   a first diode, a second resistor, a first capacitor, and a third switching element sequentially connected in series between a drain of the first NMOS transistor and a negative input terminal;
   a first resistor connected between a positive input terminal and a node between the first capacitor and the third switching element;
   a third resistor connected between a gate of the first NMOS transistor and a node between the second resistor and the first capacitor; and
   a second capacitor, a second diode, and a fourth resistor connected in parallel between a source of the first NMOS transistor and a node between the third resistor and the gate of the first NMOS transistor.

2. The electronic switch according to claim 1, further comprising a third diode connected in series between the third switching element and the negative input terminal.

3. The electronic switch according to claim 1, further comprising a second NMOS transistor connected in series in a reverse direction between the first NMOS transistor and an output terminal.

4. The electronic switch according to claim 1, further comprising a fourth switching element connected in series between the negative input terminal and a node between the third resistor and the second capacitor.

5. The electronic switch according to claim 1, wherein the second diode is a Zener diode.

6. The electronic switch according to claim 1, wherein the third switching element is a triode with a high-frequency characteristic.

7. The electronic switch according to claim 1, wherein the second capacitor is a pF level capacitor.

* * * * *